(12) United States Patent
Levin et al.

(10) Patent No.: US 7,379,580 B2
(45) Date of Patent: *May 27, 2008

(54) METHOD FOR DETECTING DEFECTS

(75) Inventors: Evgeni Levin, Cupertino, CA (US); Yehuda Cohen, Rehovot (IL)

(73) Assignee: Applied Materials, Inc., Santa Clara, CA (US)

( * ) Notice: Subject to any disclaimer, the term of this patent is extended or adjusted under 35 U.S.C. 154(b) by 569 days.

This patent is subject to a terminal disclaimer.

(21) Appl. No.: 10/916,591

(22) Filed: Aug. 12, 2004

(65) Prior Publication Data

US 2005/0013475 A1  Jan. 20, 2005

Related U.S. Application Data

(60) Division of application No. 10/200,580, filed on Jul. 23, 2002, now Pat. No. 6,829,381, which is a continuation of application No. 10/002,221, filed on Nov. 28, 2001, now abandoned.

(51) Int. Cl.
*G06K 9/00* (2006.01)
*G01R 31/26* (2006.01)

(52) U.S. Cl. ............ 382/149; 438/14; 356/237.1; 348/60; 348/125

(58) Field of Classification Search ........ 382/141–152; 438/14, 16; 356/237.1
See application file for complete search history.

(56) References Cited

U.S. PATENT DOCUMENTS

| 544,256 | A | 8/1895 | Iddings |
|---|---|---|---|
| 4,805,123 | A | 2/1989 | Specht et al. |
| 5,185,812 | A | 2/1993 | Yamashita et al. |
| 5,204,910 | A | 4/1993 | Lebeau |
| 5,544,256 | A * | 8/1996 | Brecher et al. ............. 382/149 |
| 5,659,172 | A | 8/1997 | Wagner et al. |
| 5,699,447 | A | 12/1997 | Alumot et al. |
| 5,808,735 | A | 9/1998 | Lee et al. |
| 5,911,003 | A | 6/1999 | Sones |
| 5,982,921 | A | 11/1999 | Alumot et al. |
| 6,166,801 | A | 12/2000 | Dishon et al. |
| 6,178,257 | B1 | 1/2001 | Alumot et al. |
| 6,252,981 | B1 | 6/2001 | Guest et al. |
| 6,614,924 | B1 | 9/2003 | Aghajan |
| 6,829,381 | B2 * | 12/2004 | Levin et al. ................. 382/149 |
| 2002/0088952 | A1 * | 7/2002 | Rao et al. .............. 250/559.45 |
| 2002/0172412 | A1 | 11/2002 | Jun et al. |

OTHER PUBLICATIONS

International Search Report dated Jul. 2, 2003.

* cited by examiner

*Primary Examiner*—Aaron W Carter
(74) *Attorney, Agent, or Firm*—McDermott, Will & Emery

(57) ABSTRACT

A method for inspecting a substrate for defects, including: (a) obtaining an inspected pixel and a reference pixel; (b) calculating an inspected value and a reference value, the inspected value representative of the inspected pixel and the reference value representative of the reference pixel; (c) selecting a threshold in response to a selected value out of the inspected value and the reference value; and (d) determining a relationship between the selected threshold, the reference value and the inspected value to indicate a presence of a defect.

82 Claims, 13 Drawing Sheets

METHOD FOR DETECTING DEFECTS

RELATED APPLICATIONS

This application is a divisional of application Ser. No. 10/200,580, filed Jul. 23, 2002, now issued as U.S. Pat. No. 6,829,381. Application Ser. No. 10/200,580 is a continuation of Application Ser. No. 10/002,221, filed Nov. 28, 2001, now abandoned.

FIELD OF THE INVENTION

The present invention relates to detection of defects, especially for detection of defects on the surface of semiconductor devices.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

Conventional in-process monitoring techniques employ a two phase "inspection and review" procedure. During the first phase the surface of the wafer is inspected at high-speed and relatively low-resolution. The purpose of the first phase is to produce a defect map showing suspected locations on the wafer having a high probability of a defect. During the second phase the suspected locations are more thoroughly analyses. Both phases may be implemented by the same device, but this is not necessary.

The two phase inspection tool may have a single detector or multiple detectors. A multiple detector two phase inspection device is described in U.S. Pat. Nos. 5,699,447, 5,982,921 and 6,178,257B1 of Alumot (hereinafter collectively referred to as the Alumot system) whose contents are hereby incorporated herein by reference.

During the first phase (also referred to as the inspection phase) the Alumot system (a) obtains an inspected pixel, neighboring inspected pixels and a reference pixel, (b) determines the type of the inspected pixel and/or determined the reference pixel type, (c) compares between the inspected pixel and the reference pixel and a threshold that depends upon the inspected pixel type, (d) and determines a presence of a defect in response to said comparison. The step of determining the type of a pixel involves a first stage of determining the following parameters: (i) local maxima—whether the pixel is a local maxima (if the pixel is a maximum relative to his neighbors), (ii) intensity—if the pixel is intense (if the intensity of the pixel is significant relative to a threshold), (iii) ratio—what is the ratio between the intensity of a pixel and the intensity of its neighbors relative to a threshold) and (iv) gradient—whether the pixel is located in a slope area relative to a threshold. The second stage involves classifying the pixel to one of the following types, in response to the parameters: (I) isolated peak (if the pixel is a local maxima with significant intensity and ratio), (II) multipeak (if the pixel is not an isolated peak, it has significant intensity and none of its neighbors is an isolated peak), (III) slope—if either one of the pixel's neighbors is an isolated peak or has significant gradient, or (IV) background—if the pixel has no significant intensity or gradient and none of its neighbors is an isolated peak.

Accordingly, the defect detection is responsive to the typing of the inspected pixel as the thresholds are responsive to the type of the pixel. Various errors in the measurement process, especially in noisy environment, and/or measurement inaccuracies may effect the type determination and may result in erroneous defect detections. Furthermore, the set of a pixel's types are fixed. Thus the types cannot be dynamically adjusted or tailored according to an end-user requirement.

The reference pixel is usually obtained from a previous inspection of another die, either from the same wafer or not. A comparison between pixels that were obtained from different dies, especially when the inspection tool parameters could change, may also result in erroneous determinations.

There exists a need for an improved and more robust method for inspecting a substrate, and especially a semiconductor substrate, for defects.

There exists a further need for a method for inspecting a substrate that allows a dynamic definition of pixel types.

SUMMARY OF THE INVENTION

The invention provides a method for inspecting a substrate for defects, the method includes the steps of: (a) obtaining an inspected pixel and a reference pixel; (b) calculating an inspected value and a reference value, the inspected value representative of the inspected pixel and the reference value representative of the reference pixel; (c) selecting a threshold in response to a selected value out of the inspected value and the reference value; and (d) determining a relationship between the selected threshold, the reference value and the inspected value to indicate a presence of a defect. The relationship may reflect a displacement between a pair of inspected pixel and reference pixel to the threshold. Step (d) may also include comparing between the selected threshold and a difference between the inspected value and the reference value. Ideally, at the absence of a defect, the inspected pixel and the reference pixel are equal.

The invention provides a method for inspecting a substrate for defects, the method including the steps of: (a) obtaining an inspected pixel; (b) calculating an inspected value representative of the inspected pixel; (c1) determining whether to obtain a reference pixel from a same die of the inspected pixel or from a reference pixel from another die; (c2) obtaining a reference pixel in response to the determination; (c3) calculating an inspected value representative of the inspected pixel; (d) selecting a threshold in response to a selected value out of the inspected value and the reference value; and (e) comparing the selected threshold to a difference between the reference value and the inspected value to determine the presence of a defect. Steps (a)-(b) allow for determining whether the reference pixel may be obtained from the same die. Obtaining a reference pixel from the same die as the inspected pixel and utilizing the same inspection tool and especially during the same inspection may compensate for changes in the working environment, for measurement inaccuracies and the like. It is also noted that obtaining the reference pixel from the same die may simplify the process of obtaining the reference pixel, as the reference pixel may be obtained during the same scan of the measurement unit. Usually a reference pixel may be obtained from the same die, or even from the vicinity of the inspected pixel if the inspected pixel is located in a background area. Changes of gray levels at neighboring pixels within a background area usually indicate a defect.

The step of selecting a value out of the inspected value and the reference value can be responsive to an evaluation of the noise associated with each of the inspected and reference values such to select the value that is less noisy. In many cases the less noisy value is the lower value. The selection may involve evaluating a first probability that the inspected value is erroneous and evaluating a second probability that the reference value is erroneous and selecting the value that is associated with a lower probability out of the first and second probabilities.

The inspected value is representative of the inspected pixel and/or neighboring inspected pixels. The reference value is representative of the reference pixel and/or neighboring reference pixels. The inspected value may represent a comparison between the inspected pixel and neighboring inspected pixels. The reference value may represent a comparison between reference pixel and neighboring reference pixels.

The inspected value can represent at least one of the following parameters: a gray level of the inspected pixel; a ratio between the gray level of the inspected pixel and between a combination of gray levels of at least one inspected neighboring pixel; a difference between the gray level of the inspected pixel and a combination of gray levels of at least one inspected neighboring pixel. The inspected value can reflect a difference between a maximal gray level of a neighboring inspected pixel and a minimal gray level of a neighboring inspected pixel. The inspected value can also reflect an average of gray levels of neighboring inspected pixels or even an average between gray levels of neighboring inspected pixels and the gray level of the inspected pixel.

The reference value can represent at least one of the following parameters: a gray level of the reference pixel; a ratio between the gray level of the reference pixel and between a combination of gray levels of at least one reference neighboring pixel; a difference between the gray level of the reference pixel and a combination of gray levels of at least one reference neighboring pixel. The reference value can reflect a difference between a maximal gray level of a neighboring reference pixel and a minimal gray level of a neighboring reference pixel. The reference value can also reflect an average of gray levels of neighboring reference pixels or even an average between gray levels of neighboring reference pixels and the gray level of the reference pixel.

According to an aspect of the invention the selected value is utilized for determining a reference pixel and inspected pixel type. It is noted that the selection of a single type for both pixels allows to overcome noise, measurement inaccuracies, and measurement mismatch, especially as the selection can be based upon the less noisy value, a value that is considered to be less erroneous.

The invention provides a method that includes a step of building a pixel type database reflecting the commonality of distinct values of a selected value. The database can be in the form of a histogram, but this is no necessary. Usually the method further includes an allocation of selected value ranges to pixel types. Conveniently, adjacent selected value ranges are delimited at local minima of a commonality graph representative of the relationship between a selected value and its commonality. The location of inter-type boarders at local minima of the histogram minimizes the amount of erroneous type classification resulting from noisy measurements and from measurement inaccuracies.

The allocation of value ranges can also be responsive to a minimal amount of data points within each value range. The amount of data points may be reflected by local maxima or even local maxima that are above a predefined threshold, to assure that each range includes significant amount of data points.

The allocation of value ranges can be responsive to inputs provided by an end-user, thus allowing for tailoring the method to end-users requirements.

Usually, the allocation is responsive to various types of areas on the die, these areas include patterned areas of a die, and background of a die. These area can also include periodic cells (also referred to as memory cells), non-periodic cells (also referred to logic cells) and background, accordingly.

According to an aspect of the invention, the database can be dynamically updated during the execution of the method, thus allowing adjustments to current information. The update can be done whenever the method is performed but it can also be made only if a defect was not detected.

According to an aspect of the invention the method includes a step of building a reference inspected database reflecting the communality of a pair of inspected value and reference value. At least one threshold can be determined in view of the reference inspected database. These databases can be represented as histograms.

According to yet another aspect of the invention, the invention involves building, for each pixel type, a reference inspected type database reflecting the communality of a pair of inspected value and reference value of pixels that belong to that pixel type. Each pixel type is associated with a threshold. The threshold is determined in view of the reference inspected type database. Conveniently, the step of selecting a threshold out of a set of thresholds comprises selecting a threshold that is associated with a pixel type of the selected pixel out of the inspected pixel and the reference pixel.

The reference inspected type database is an N-dimensional histogram, N being an integer that exceeds one. The threshold can be a line that is tangent to the histogram envelope, a line that is substantially parallel to the mean of data points that form the histogram, a line that is located at a predetermined distance from the histograms envelope, or a line that reflects data points that are located within a predefined statistical parameter from the mean of data points that form the histogram.

The reference pixel may be obtained from memory, from another die or from a pattern that is ideally identical to a pattern from which the inspected pixel is obtained.

The invention provides a method wherein the step of determining a relationship between the selected threshold, the reference value and the inspected value to indicate a presence of a defect includes providing an alarm signal indicative of a probability of a presence of a defect. Conveniently, a value of the alarm signal is responsive to a distance between the selected threshold and the pair of inspected value and reference value. The invention provides a method for inspecting a substrate for defects, the method includes the steps of: (i) obtaining an inspected pixel, inspected neighboring pixels and a reference pixel; (ii) calculating an inspected value, a second inspected value and a reference value, the second inspected value representative of the inspected pixel alone, the reference value representative of the reference pixel and neighboring reference pixels and the inspected value representative of the inspected pixel and inspected neighboring pixels; (iii) selecting a first threshold and a second threshold in response to a selected value out of the inspected value and the reference value; (iv) determining a first relationship between the selected first threshold, the inspected value and the second inspected value, determining a second relationship between the selected second threshold, the inspected value and the reference value; and (v) indicating a presence of a defect in response to at least one of the first relationship and the second relationship.

The first relationship can reflect a distance between the selected first threshold and a data element reflecting both the inspected value and the second inspected value. The second relationship reflects a distance between the selected second threshold and a data element reflecting both the inspected value and the reference value. The step of indicating including selecting a selected relationship out of the first relationship and the second relationship. Each relationship may reflect a probability of a presence of a defect; and wherein selecting the relationship that reflects a higher probability of a presence of a defect.

The second inspected value reflects a brightness of the inspected pixel. The method can further include a step of building a reference inspected database reflecting the communality of a pair of inspected value and reference value, and building an inspected neighborhood database reflecting the communality of pair of inspected value and neighboring inspected value. The method can include a step of defining a set of first thresholds in response to the reference inspected database, and a step of defining a set of second thresholds in response to the inspected neighborhood database.

The method can further include a step of building, for each pixel type, a neighborhood inspected type database reflecting the communality of a pair of inspected value and reference value of pixels that belong to that pixel type. The method can also include a step of determining a second threshold for each pixel type in response to the neighborhood inspected type database associated with said pixel type. The step of selecting a second threshold out of a set of second thresholds includes selecting a second threshold that is associated with a pixel type of the selected pixel out of the inspected pixel and the reference pixel. The second threshold can include (a) a line that is tangent to the histogram envelope, (b) a line that is substantially parallel to the mean of data points that form the histogram, (c) a line that is located at a predetermined distance from the histograms envelope, or (d) a line that reflects data points that are located within a predefined statistical parameter from the mean of data points that form the histogram.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Figure 1:
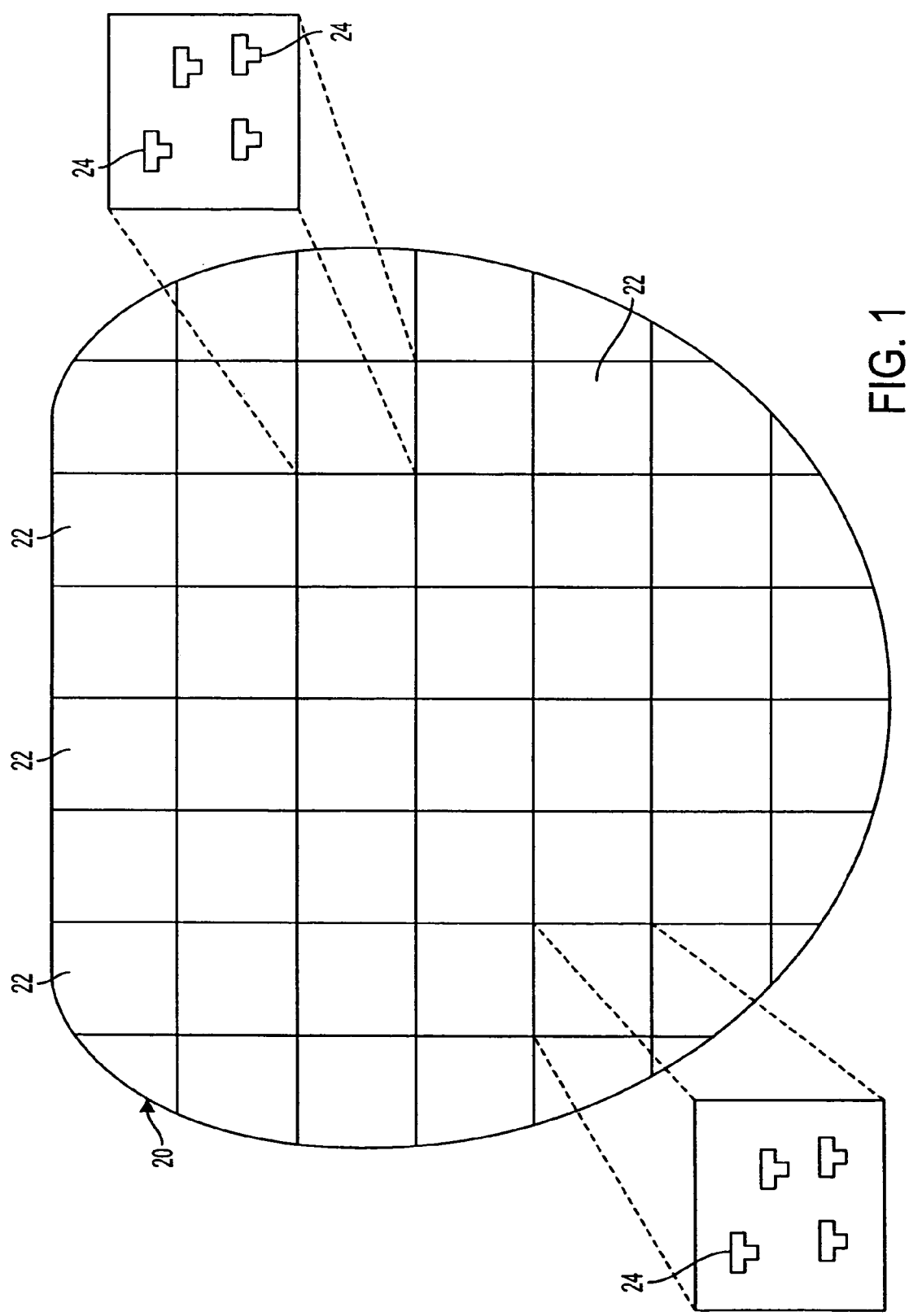
FIG. 1 illustrates a wafer to be inspected by the method for defect detection, in accordance with an embodiment of the invention.

Referring to FIG. 1, an article to be inspected, such as a semiconductor wafer 20, is processed (prior to inspection) to have a plurality of ideally identical patterned integrated circuit dies 22, each die 22 having a comparable patterns, such as the T-shaped patterns 24 formed on the surface of wafer 20. It is noted that a single die may include a large amount of patterns that well exceed millions of patterns per die. A semiconductor die usually includes a plurality of layers. A pattern, such as local pattern 24 may be a part of a metal interconnection line, a trench, a via, a conductive gate, etc. It is noted that various areas on the die are usually categorized to background areas (that are ideally very smooth), memory areas (that include a large number of repetitive patterns) or logic areas (that usually do not include large quantities of adjacent repetitive patterns). It is noted that the method allows for dynamic definition of other categories/types and also for dynamic definition of inter-type borders, as illustrated in further details in reference to FIGS. 4 and 5.

The method can be implemented by various detection tools, as means and methods for obtaining pixels are known in the art. The detection tools may have a single detector, multiple detectors, dark field detectors, bright field detectors or any combination of detectors. Alumot system is a multi detector system but other multi-detector systems having other arrangement of detectors may be implemented.

Figure 2:
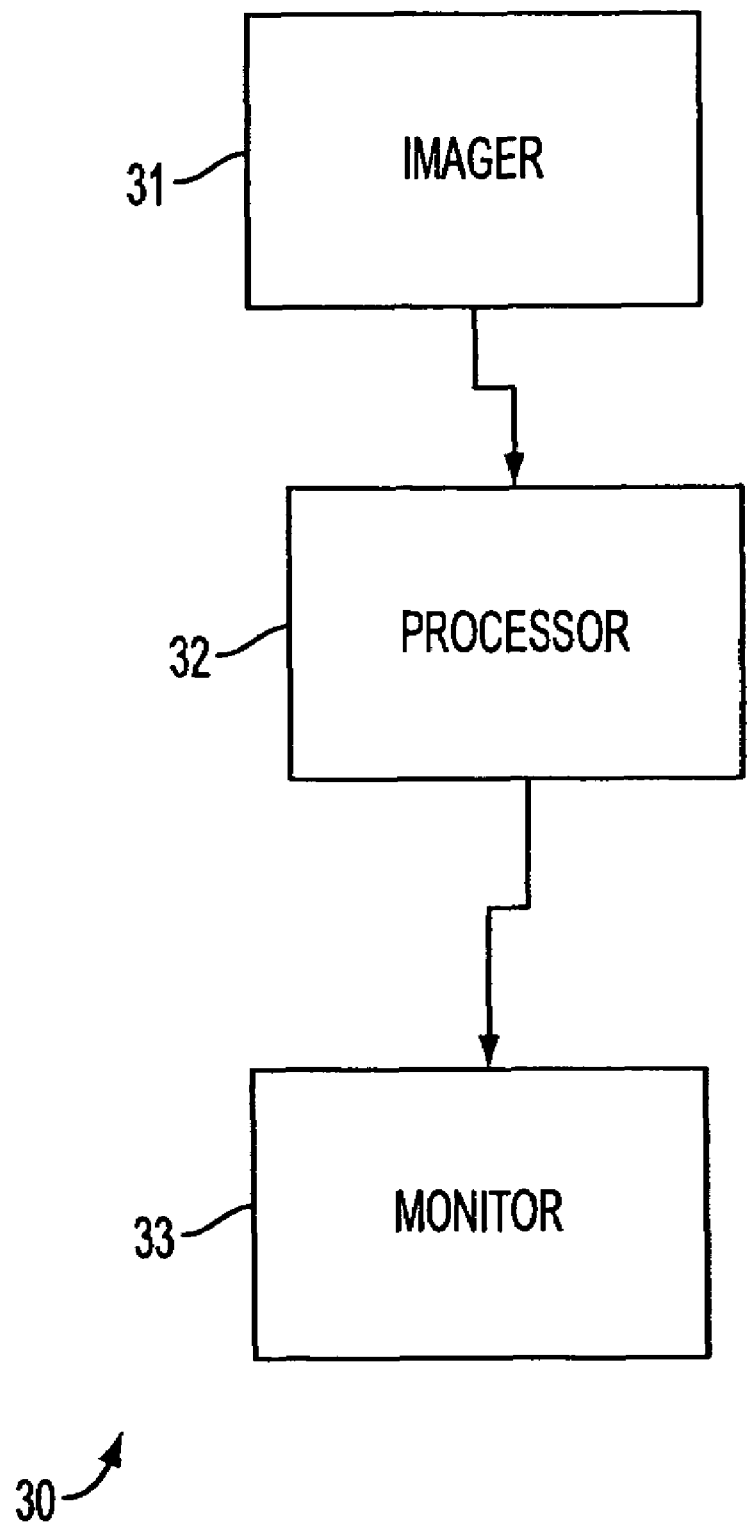
FIGS. 2-3 illustrate systems for defect detection and for obtaining pixels, in accordance with an embodiment of the invention.

Referring to FIG. 2, illustrating an inspection tool 30 for implementing the method for defect detection. Inspection tool 30 includes: (A) Imager 31 for scanning the surface of wafer 20. (B) Processor 32, which preferably performs the analysis disclosed herein electronically, and (C) Monitor 33 for displaying results of the analyses of processor 32. Typical inspection tools suitable for scanning wafers include the Compass, available from Applied Materials, Inc. of Santa Clara, Calif.

Figure 3:
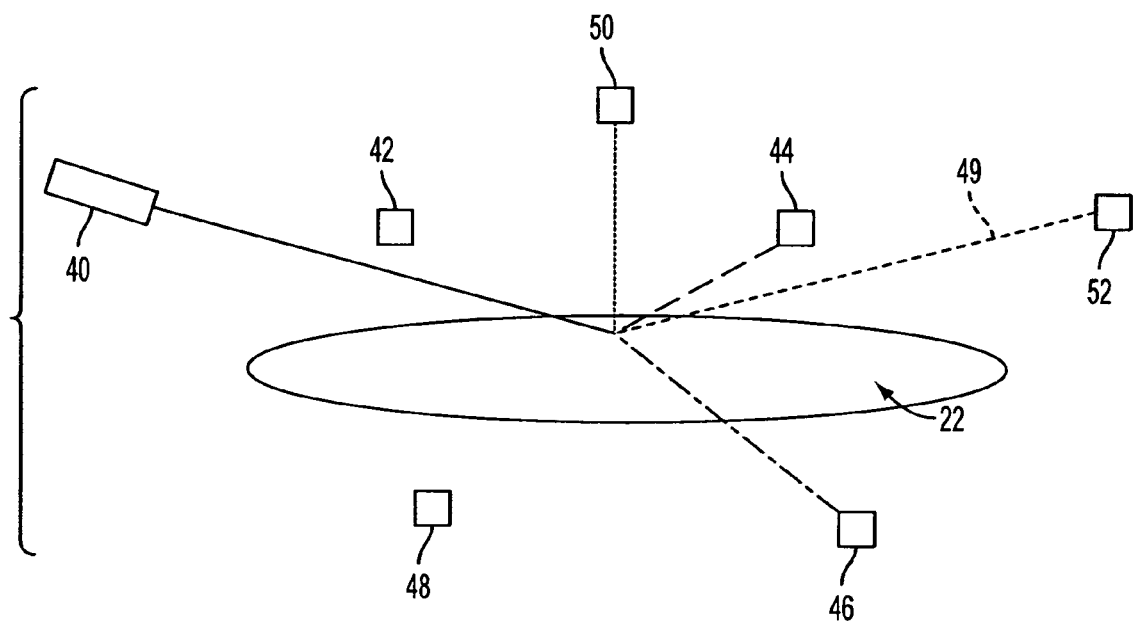

Referring to FIG. 3, illustrating a system for obtaining pixels, in accordance with an embodiment of the invention. A light beam source 40 is provided at a grazing angle to a wafer 22. Four detectors, such as PMTs 42, 44, 46 and 48, are also provided at a grazing angle, but are arranged spatially away from the normal reflection direction (i.e., Snell's Law reflection) of light beam 49. Thus, four detectors 42, 44, 46, 48 provide dark field images from four perspectives in the form of continuous data streams. An additional dark field detector 50 is situated at ninety degrees to the wafer's surface. A bright field detector 52 receives the normal reflection beam 49. Bright field detector 52 may be a point sensor or a plurality of light sensors, such as a CCD.

Figure 4:
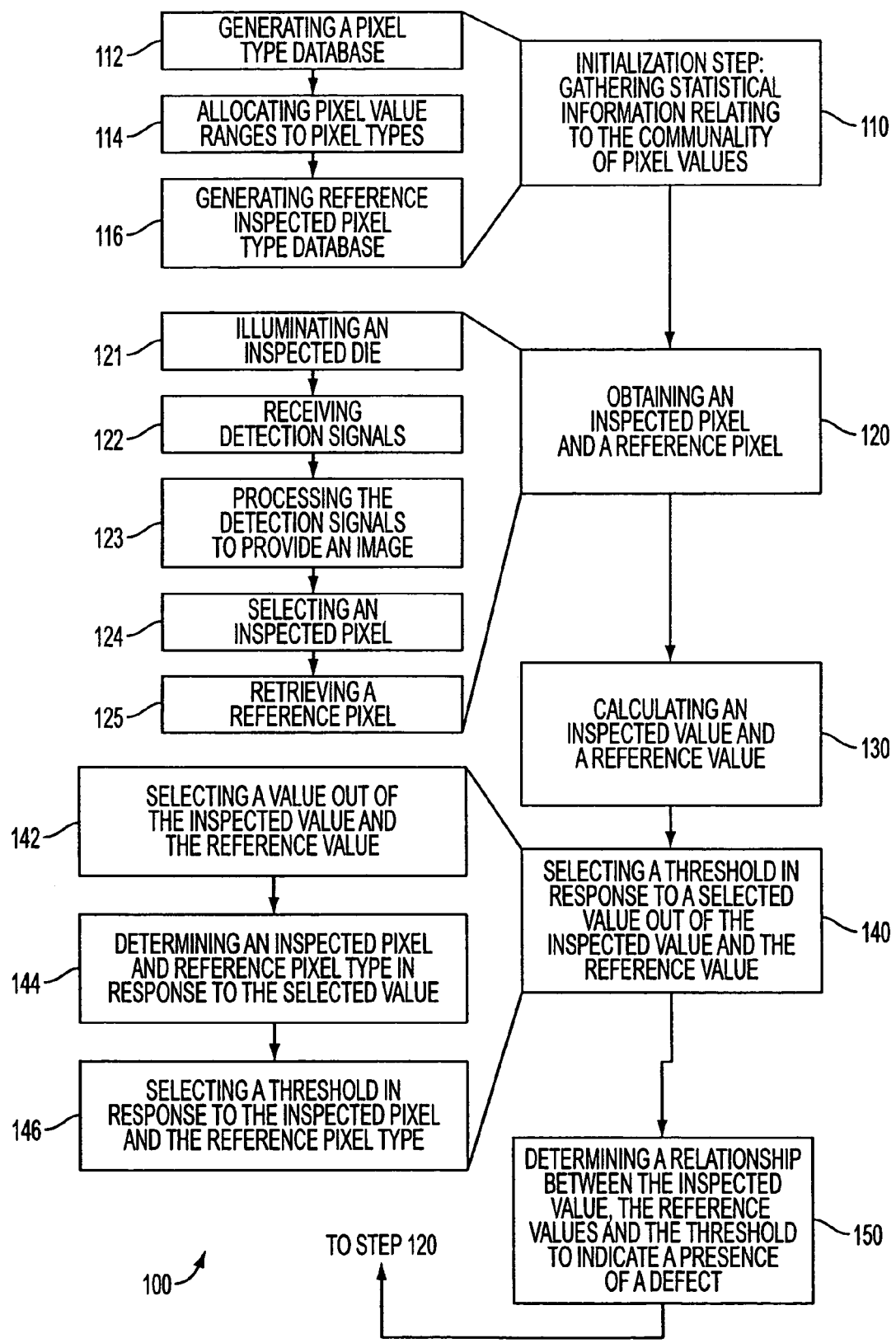
FIG. 4 is a flow chart illustrating a method for defect detection, in accordance with an embodiment of the invention.

FIG. 4 illustrates method 100 for inspecting a substrate for defects, in accordance with a preferred embodiment of the invention.

Method 100 starts by initialization step 110. Step 110 includes gathering statistical information relating to the communality of pixel values. It is noted that during step 110 a plurality of dies may be inspected to build a statistically significant sample population, determined in a manner known to those skilled in the art.

Step 110 may include step 112 of generating a pixel type database. An exemplary pixel type database is graphically illustrated at FIG. 5. The pixel type database reflects the commonality of pixel variance value. A variance of a pixel reflects a relationship between neighboring pixels of that pixel but can also reflect a relationship between the pixel and its neighboring pixels. Neighboring pixels are located within a neighborhood pattern that can be of various shape and size. Usually, the pixel is located at the middle of the neighborhood pattern, but this is not necessary. A neighborhood pattern is usually of rectangular shape, but this is not necessary. For convenience of explanation it is assumed that the neighborhood pattern is a grid of N×M pixels. The variance v of the a pixel CP is a single valued function of the set of the gray levels Aij of the pixel's neighborhood, wherein i is an integer from 1 to N and j is an integer from 1 to M. The variance of the central pixel v(Ai,j) can be equal to: (a) the difference between the highest and lowest gray levels of the neighborhood, (b) the average value of the neighborhood gray levels or (c) the weighted average value of the neighborhood, and the like.

It is noted that in many cases a reflected light beam from one spot on the die can be much brighter (usually up to 1,000,00 times more brighter) than a reflected light beam from another spot of the die or from the same spot but at a different angle. In many inspection tools, only a relatively limited range of brightness values (also known in the art as gray levels) is assigned to describe a pixels difference. Commonly, the range spans between 0 and 255. The detectors are usually calibrated to that limited range of brightness. Accordingly, the value of 255 is assigned to pixels that have at least a brightness level of 255. These signals are usually referred as saturated signals. According to an aspect of the invention if either one of a pixel or its neighboring pixels have a gray level of 255 the variance of tat pixel is set to its highest level, as the difference between the saturated value and other pixels are actually not known.

Figure 5:
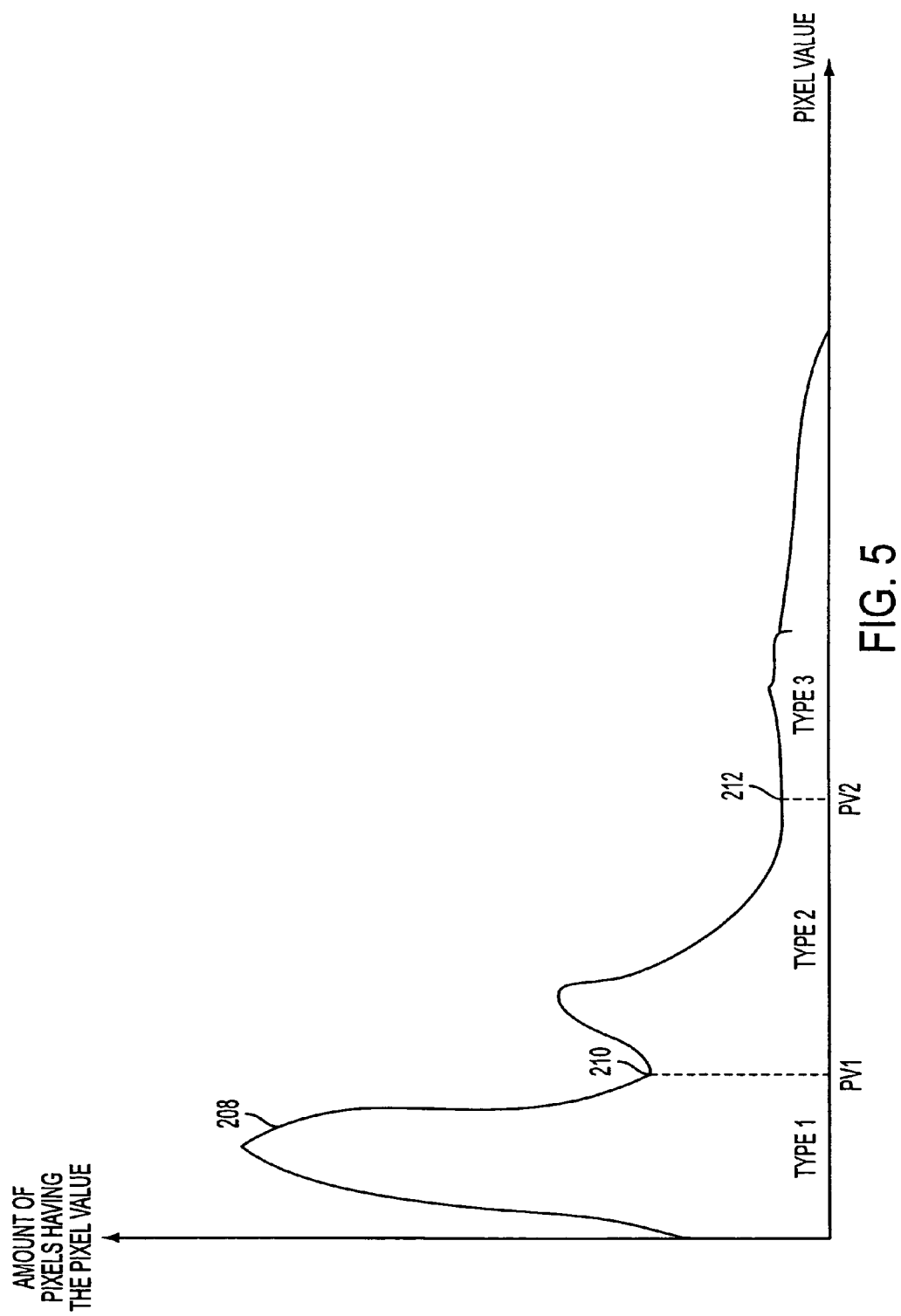
FIG. 5 is a graphic description of a pixel type database, in accordance with an embodiment of the invention.

Step 112 is followed by step 114 of allocating a selected value ranges to pixel types. Conveniently, adjacent selected value ranges are delimited by inter-type boarders that are located at local minima of the histogram. Referring to FIG. 5, three adjacent value ranges types (denoted TYPE 1, TYPE 2 and TYPE 3) are delimited by inter-type boarders that are located at local minima PV1 210 and PV2 212 respectively of histogram 208. Locating the inter-type boarders at the local minima reduces the amount of erroneous typing, as each boarder is surrounded by relatively less common pixel values.

It is noted that the allocation of value ranges can also be responsive to the amount of data points within each value range, to a location of local maxima and even local maxima that are above a predefined threshold, such as to assure that each range includes significant amount of data points. Step 418 can also include allocating the value ranges in response to inputs provided by an end-user, thus allowing to tailor the method to an end users requirements.

Usually, the allocation is responsive to various types of area on the die, these areas include patterned areas of a die, and background of a die. These area can also include periodic cells (also referred to as memory cells), non-periodic cells (also referred to logic cells) and background areas, accordingly. Referring to FIG. 5, TYPE 1 being characterized by the lowest pixel variance values represents a background area. TYPE 3 being characterized by highest pixel variance values represents a non-periodic, such as "logic" area. TYPE 2 represents a patterned area that includes repetitive patterns, such as memory cells.

Figure 6:
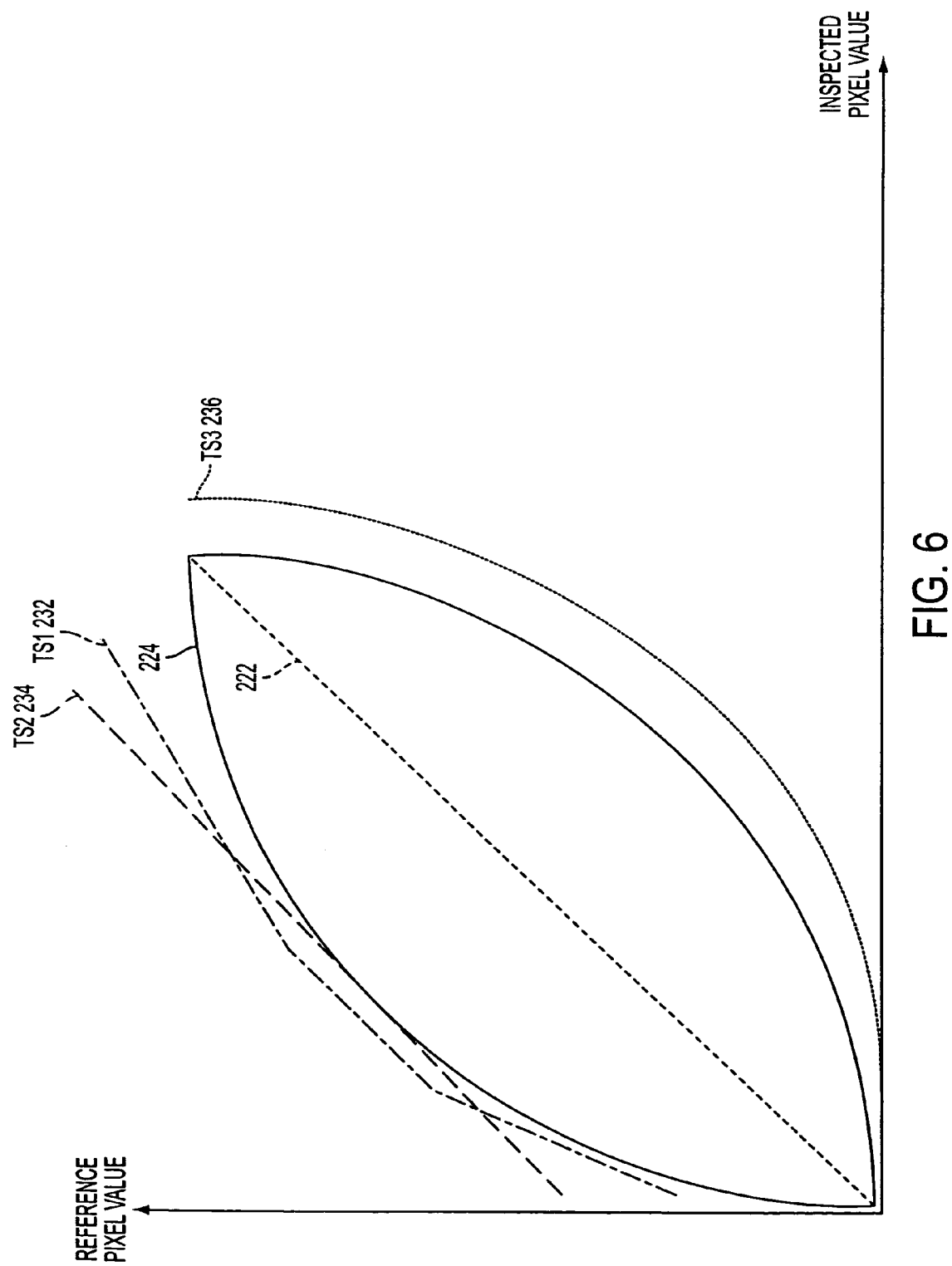
FIGS. 6-9 are graphic descriptions of reference inspected type databases, in accordance with embodiments of the invention.
Figure 7:
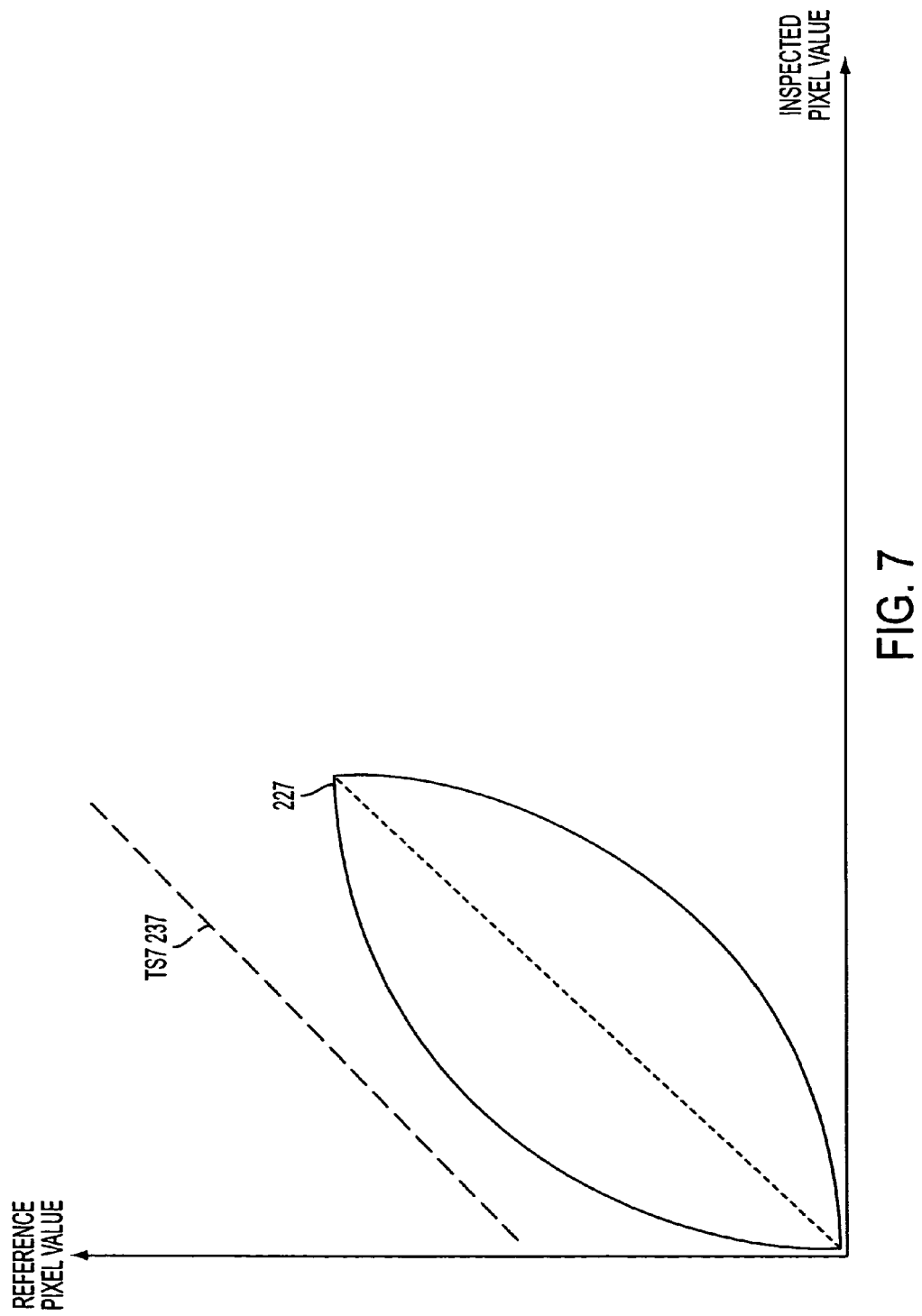
Figure 8:
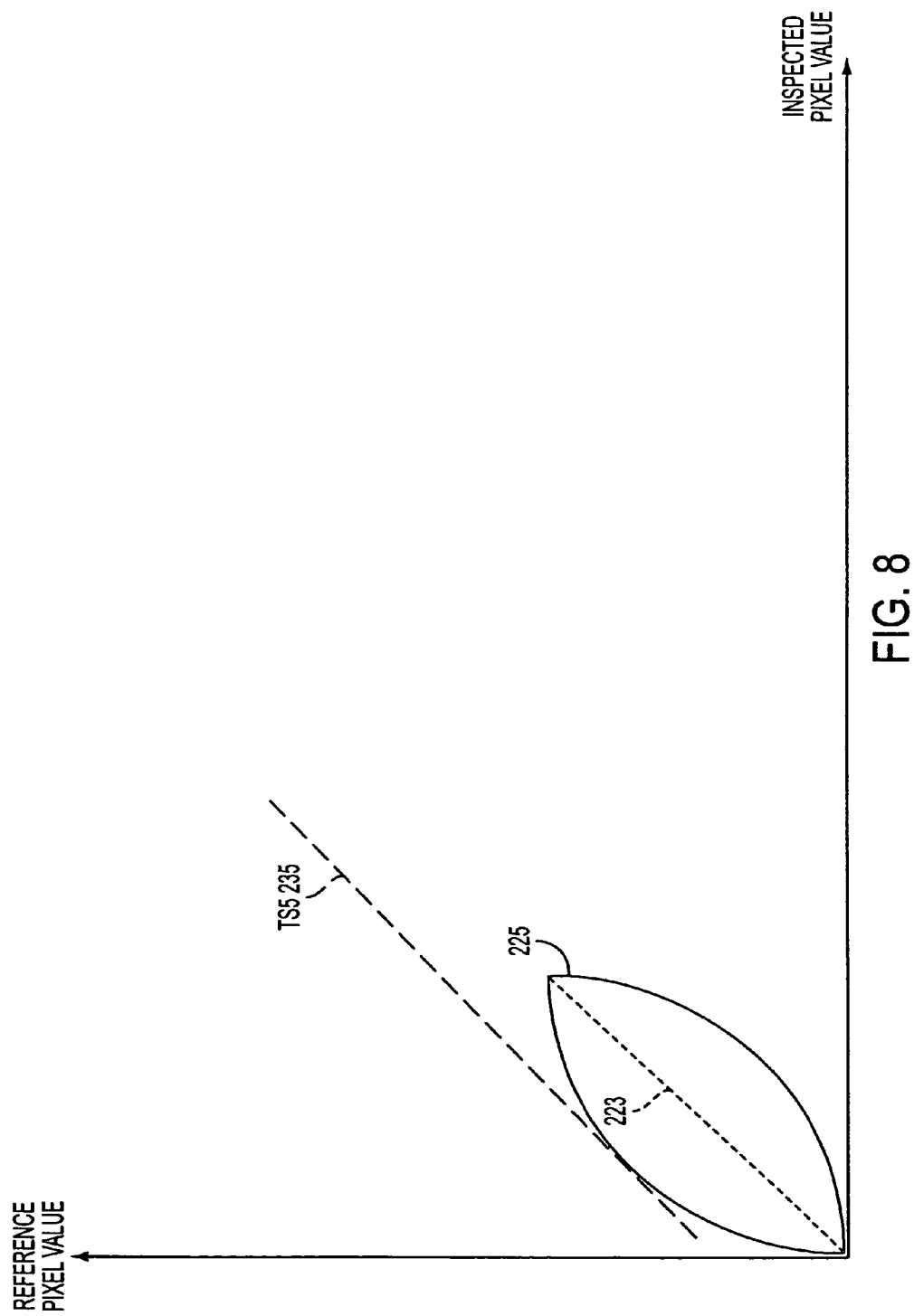
Figure 9:
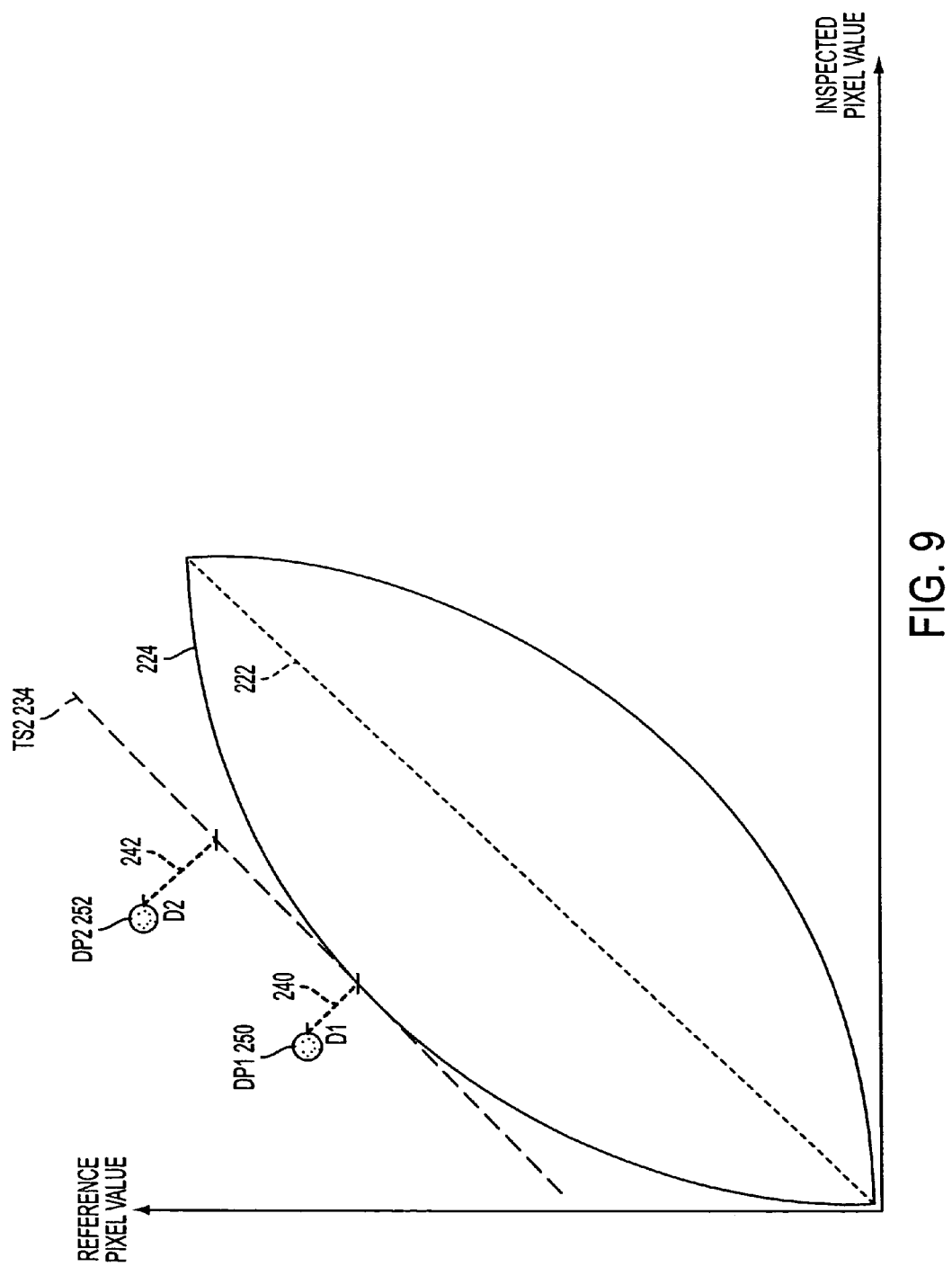

Step 114 is followed by step 116 of generating a reference inspected type database reflecting the communality of a pair of (inspected value, reference value) of pixels that belong to that type. Referring to FIGS. 6-8, each type out of TYPE 1-TYPE 3 has a reference inspected type database. These figures graphically illustrate a two dimensional graph, but actually the graph is three-dimensional, whereas the x-y plane illustrates pair of (inspected pixel value, reference pixel value), while the z-axis illustrated the amount of pairs that have the same value. Step 116 further includes defining a histogram envelope and defining a threshold. Referring to FIGS. 6-8 illustrating histogram envelopes 224 and 225, and various threshold lines TS1 232, TS2 234, TS3 236, TS5 235 and TS7 237. The histogram envelope is selected such as to include a predefined amount of pairs, or to guarantee a predefined amount of false alarms. Thresholds may be selected in accordance with various criteria. For example, threshold TS2 234 is line that is tangent to histogram envelope 224 of FIG. 6. Threshold TS1 232 includes three straight lines that are locates slightly above histogram envelope 224. Threshold TS7 237 is a line that substantially parallel to the mean 227 of data points that form the histogram of FIG. 7. TS3 236 is line that is located at a predetermined distance from histogram envelope 224. It is noted that other thresholds may be selected, such as threshold that include a line that reflects data points that are located within a predefined statistical parameter from the mean of data points that form the histogram. As illustrated by FIG. 9, a location of a pair of inspected pixel value and reference pixel value, such as DP2 252 and DP1 251, is compared to a location threshold TS2 234 to provide an indication about the presence of a defect.

It is noted that step 150 may be followed by steps 114 and 116, for refreshing the databases with currently inspected pixel values. The database may only be refreshed if a defect was not detected.

Step 110 is followed by step 120 of obtaining an inspected pixel and a reference pixel. The inspected pixel can be obtained by various detection systems, such as but not limited to the systems of FIGS. 2 and 3. A reference pixel is usually obtained from a storage unit, but it can also be obtained by the detection system itself. Step 120 usually includes the following steps: (A) Step 121 of illuminating an inspected die, for example by light beam source 200 of FIG. 3. (B) Step 122 of receiving detection signals by at least one detector, such as PMTs 220, 225, 230, 235, 240 and/or 250. (C) Step 123 of processing the detection signals to provide an image of a portion of the illuminated die, the image includes a grid of pixels, each characterized by a signal such as a gray level signal. (D) Step 124 of selecting which pixel out of the grid of pixels to currently process, said pixel being the inspected pixel. The selection may follow a predefined pattern, such as a raster scan pattern, but other selection schemes may be implemented. (E) Step 125 of retrieving a reference pixel out of a storage unit. It is noted that step 120 usually includes an alignment step such that the inspected pixel and the reference pixel relate to the same location on the inspected die and reference die, or to the same location on different patterns on the same die, respectively. Alignment methods are known in the art. An illustration of a method for such an alignment is described in U.S. Pat. Nos. 5,699,447, 5,982,921 and 6,178,257B1 of Alumot. Another alignment method is described at U.S. Pat. No. 5,659,172 of Wagner.

Step 120 is followed by step 130 of calculating an inspected value and a reference value, the inspected value representative of the inspected pixel and the reference value representative of the reference pixel. For convenience of explanation it is assumed that the inspected value is a variance of the inspected pixel and the reference value is the variance of the reference pixel, although other functions may be selected to generate the inspected value and the reference value.

Step 130 is followed by step 140 of selecting a threshold in response to a selected value out of the inspected value and the reference value. Step 140 includes step 142 of selecting a value out of the inspected value and the reference value. The selection involves evaluating which value out of the reference value and the inspected value is more noisy and selecting the less noisy value. Usually, the selected value is the lower value, but this is not necessary and depends upon the properties of both signal and noise within the detection system. These properties may include the probabilistic distribution of the noise. Step 142 may also include an evaluation of a first probability that the inspected value is erroneous, an evaluation of a second probability that the reference value is erroneous and a selection of the value that is associated with a lower probability out of the first and second probabilities.

Step 142 is followed by step 144 of determining a inspected and reference pixel type in view of the selected value. Referring to FIG. 5, if the selected value is smaller than PV1 then TYPE 1 is selected as the type of both reference pixel and inspected pixel. If the selected value is equal to PV1 or is greater than PV1 but smaller than PV2 then TYPE 2 is selected as the type of both reference pixel and inspected pixel. If the selected value is equal to PV2 or greater than PV2 then TYPE 3 is selected as the type of both reference pixel and inspected pixel.

Step 144 is followed by step 146 of selecting a threshold in response to the selected type.

Step 140 is followed by step 150 of determining a relationship between the selected threshold, the reference value and the inspected value to indicate a presence of a defect. Step 150 involves determining the location of a pair of (inspected value, reference value) that are characterized by a type, in relation to the threshold of that type. Referring to FIGS. 6-8, if the inspected and reference pixel type is TYPE 2 then step 150 includes determining whether pair of (inspected value, reference value) are above threshold TS7 237. If the answer is "no", indicating that there is no defect, then method 100 can continue to check other inspected pixels, and step 150 is followed by step 120 (if another die or another portion of a die must be illuminated to obtain a pixel) or step 124 (for processing another pixel from an image that was already acquired during steps 121-123). If the answer is "yes", indicating that there is a defect an additional step of evaluating the distance between the pair (inspected value, reference value) and threshold TS7 237. The length of said distance is usually proportional to a probability of a presence of a defect, although he length can also be responsive to th type of defect (for example, the material from which a particle is made and the like). In such a case step 150 includes generating a fault indication signal. The fault indication signal can be utilized by defect review devices, such as phase II of the Alumot system. If the inspected and reference pixel type is TYPE 2 then step 150 includes determining whether pair of (inspected value, reference value) are above threshold TS7 237. If the inspected and reference pixel type is TYPE 1 then step 150 includes determining a relationship between said pair and a single threshold, previously selected out of TS1 232, TS2 234 and TS3 236. FIG. 9 illustrates two pairs of (inspected value, reference value), denoted DP1 150 and DP2 152 that are located above threshold TS2 234. The distance D1 140 and D2 142 may indicate the probability of a presence of a defect.

Figure 10:
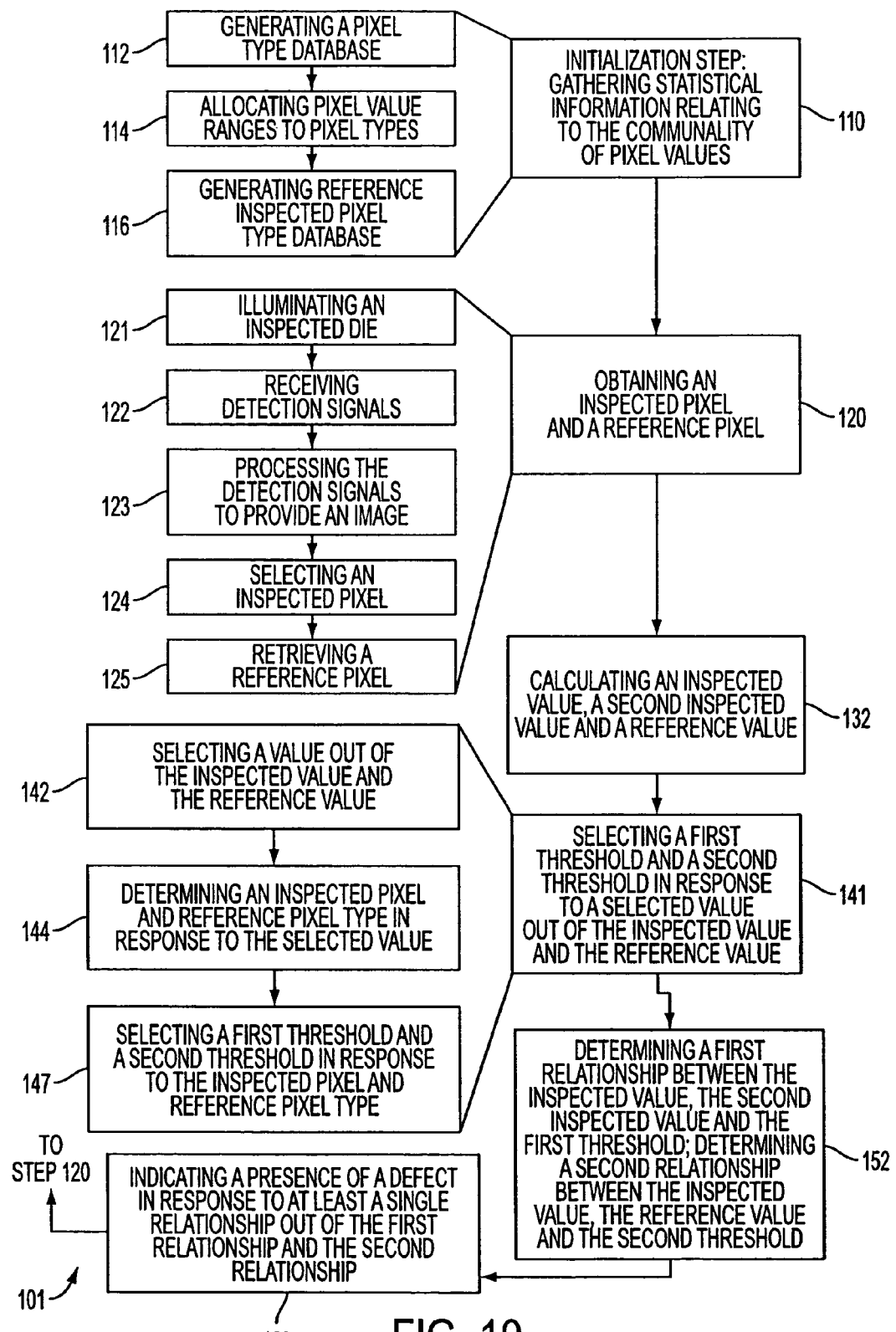
FIG. 10 is a flow chart illustrating a method for defect detection, in accordance with an embodiment of the invention.

FIG. 10 illustrates method 101 for inspecting a substrate for defects, in accordance with a preferred embodiment of the invention.

Method 101 starts by initialization step 110. Step 110 includes gathering statistical information relating to the communality of pixel values. It is noted that during step 110 a plurality of dies may be inspected to build a statistically significant sample population, determined in a manner known to those skilled in the art.

Step 110 may include step 112 of generating a pixel type database. An exemplary pixel type database is graphically illustrated at FIG. 5.

Step 112 is followed by step 114 of allocating a selected value ranges to pixel types.

Figure 11:
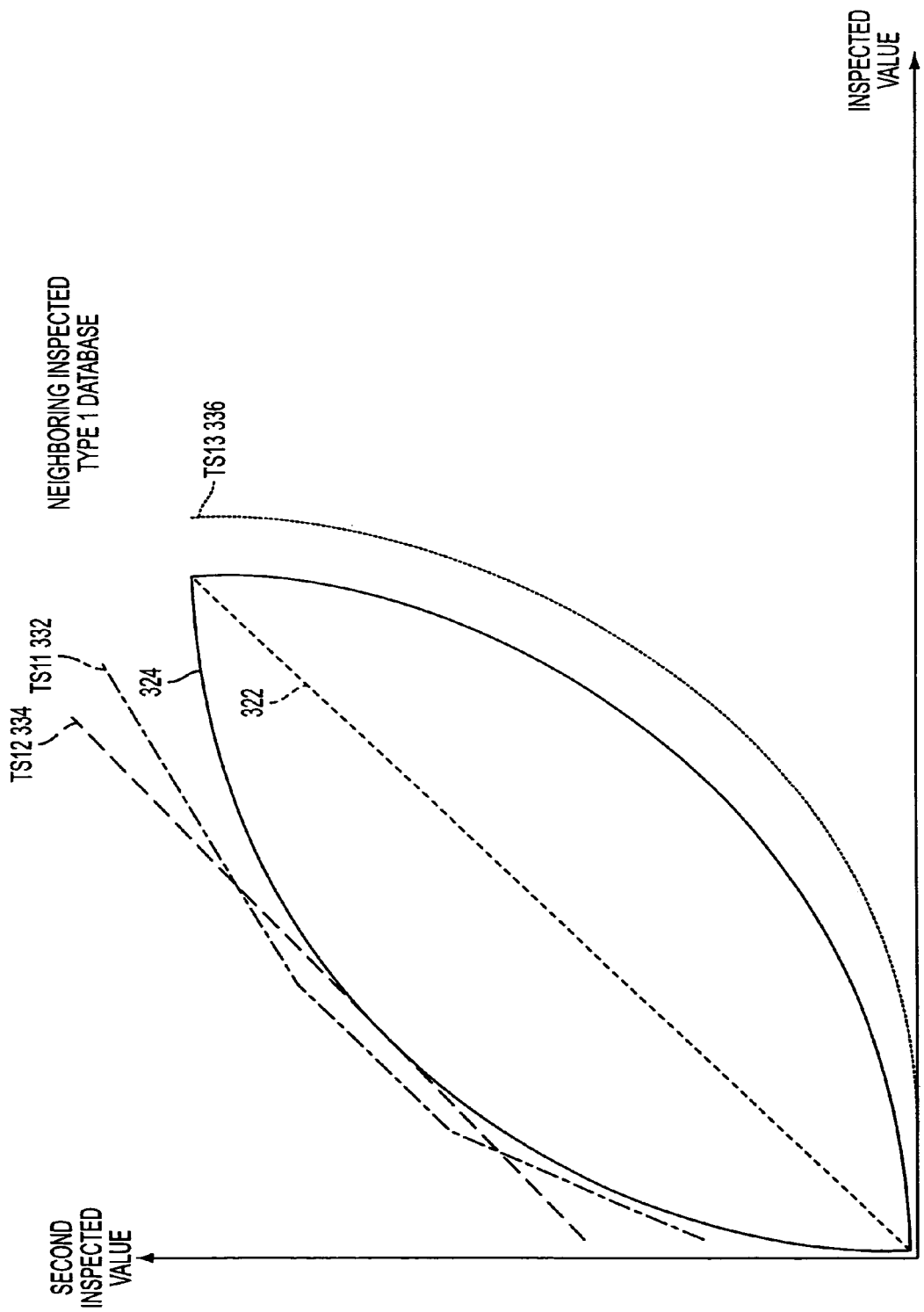
FIGS. 11-13 are graphic descriptions of neighboring inspected type databases, in accordance with embodiments of the invention.
Figure 12:
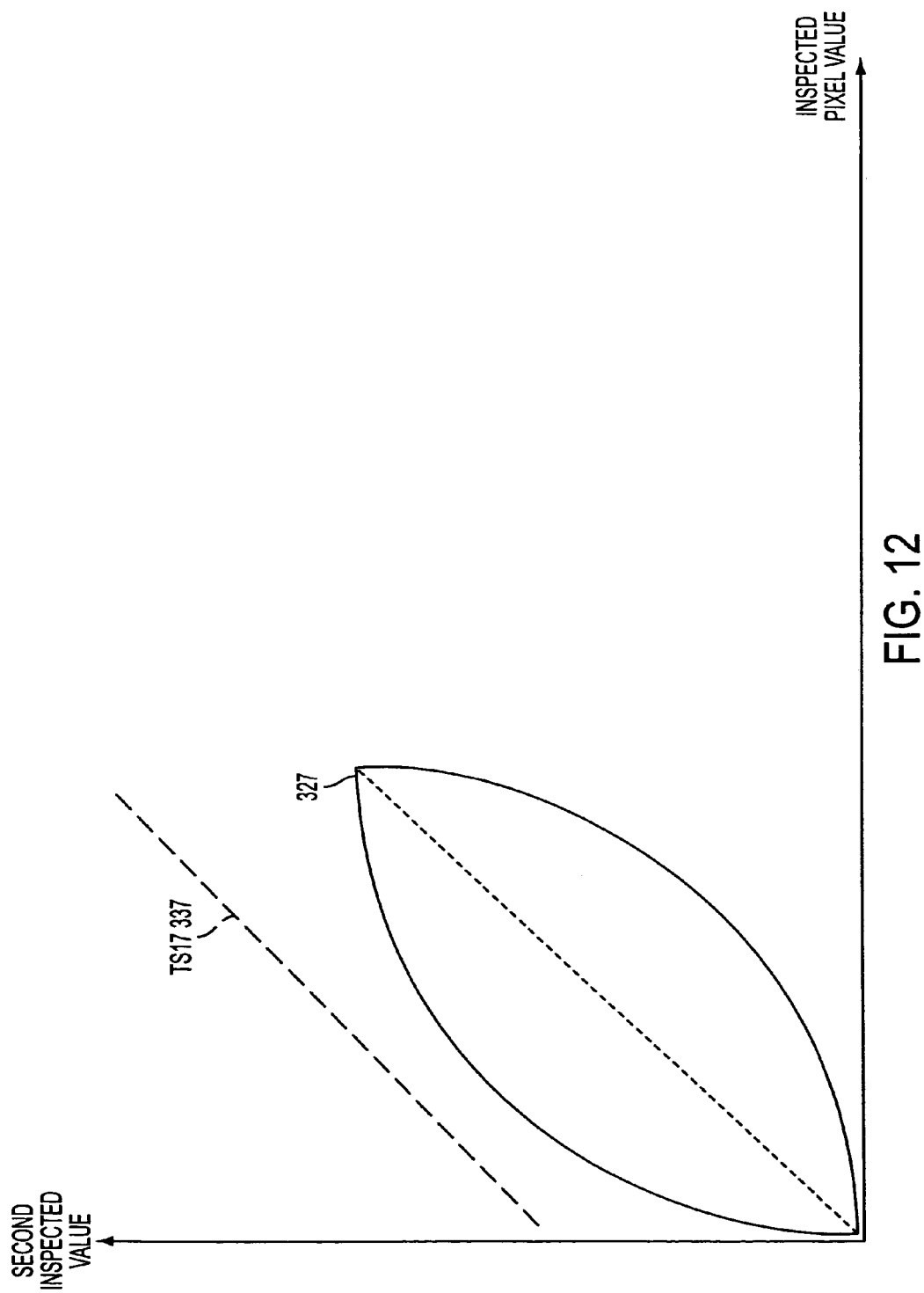
Figure 13:
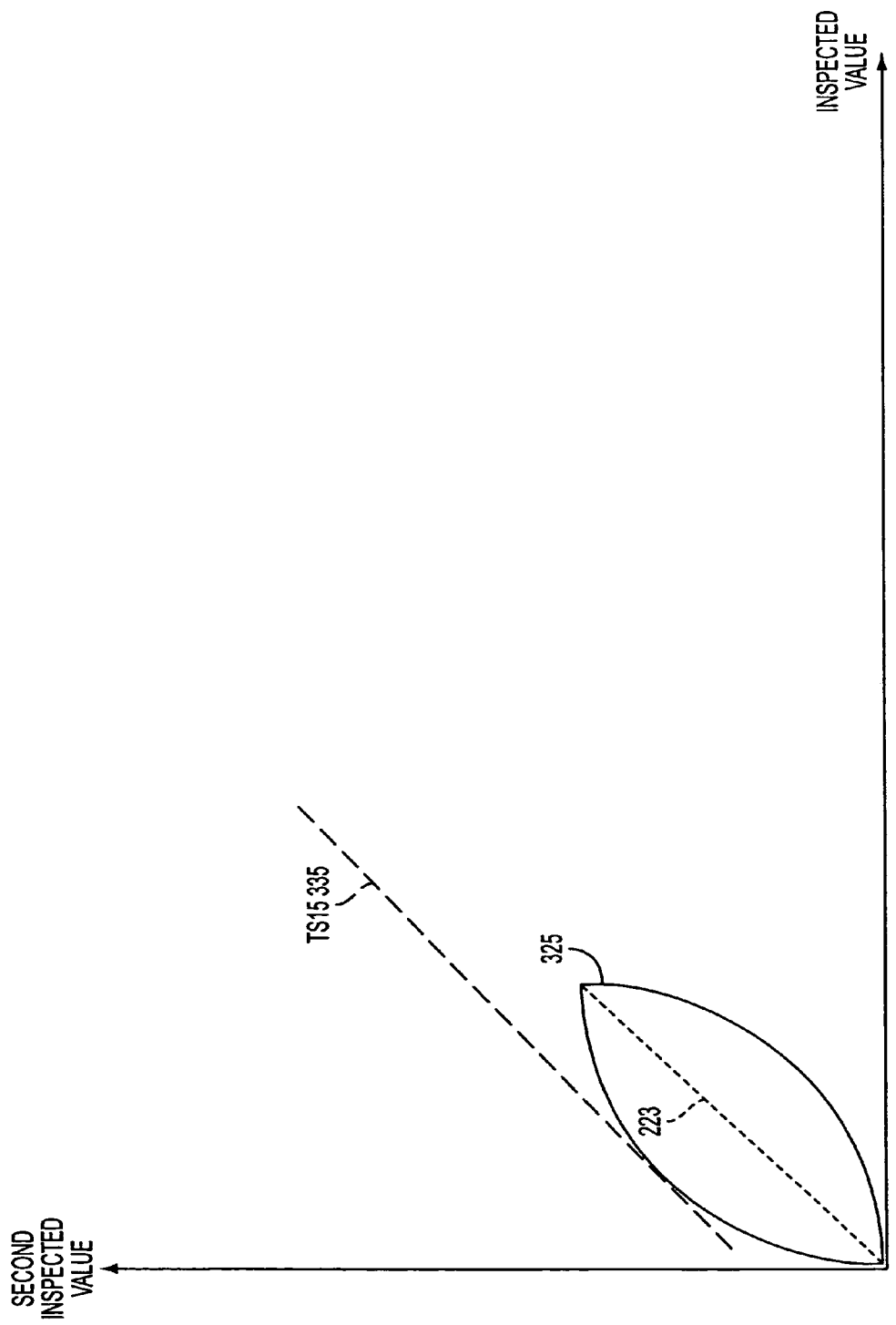

Step 114 is followed by step 118 of generating a reference inspected type database reflecting the communality of a pair of (inspected value, reference value) of pixels that belong to that type, and generating a neighboring inspected type database reflecting a communality of (second inspected value, inspected value) of pixels that belong to that type. Second inspected value represents the inspected pixel itself, while the inspected value represents either neighboring inspected pixels or a relationship between the inspected pixel and the neighboring inspected pixels. For example, the second inspected value represents the intensity/brightness of the inspected pixel while the inspected value represents a variance of the inspected pixel. FIGS. 6-8 illustrate exemplary reference inspected type databases, while FIGS. 11-13 illustrate neighborhood inspected type databases. Each type out of TYPE 1-TYPE 3 has a reference inspected type database and a neighborhood inspected type database. FIGS. 11-13 graphically illustrate a two dimensional graph, but actually the graph is three-dimensional, whereas the x-y plane illustrates pair of (inspected value, second inspected value), while the z-axis illustrated the amount of pairs that have the same value. Step 118 further includes defining a histogram envelope and defining a threshold. Referring to FIGS. 11-13 illustrating histogram envelopes 324 and 325, and various threshold lines TS11 332, TS12 334, TS13 336, TS15 335 and TS17 337. The histogram envelope is selected such as to include a predefined amount of pairs, or to guarantee a predefined amount of false alarms. Thresholds may be selected in accordance with various criteria. For example, threshold TS12 334 is line that is tangent to histogram envelope 324 of FIG. 11. Threshold TS11 332 includes three straight lines that are locates slightly above histogram envelope 324. Threshold TS17 337 is a line that substantially parallel to the mean 327 of data points that form the histogram of FIG. 12. TS13 336 is line that is located at a predetermined distance from histogram envelope 324. It is noted that other thresholds may be selected, such as threshold that include a line that reflects data points that are located within a predefined statistical parameter from the mean of data points that form the histogram.

It is noted that step 150 may be followed by steps 114 and 118, for refreshing the databases with currently inspected pixel values. The database may only be refreshed if a defect was not detected.

Step 110 is followed by step 120 of obtaining an inspected pixel and a reference pixel. The inspected pixel can be obtained by various detection systems, such as but not limited to the systems of FIGS. 2 and 3. A reference pixel is usually obtained from a storage unit, but it can also be obtained by the detection system itself.

Step 130 is followed by step 140 of selecting a first threshold and a second threshold in response to a selected value out of the inspected value and the reference value. Step 140 includes step 142 of selecting a value out of the inspected value and the reference value. Step 142 is followed by step 144 of determining a inspected and reference pixel type in view of the selected value. Step 144 is followed by step 147 of selecting a first threshold and a second threshold in response to the selected type.

Step 140 is followed by step 152 of determining a first relationship between the selected first threshold, the inspected value and the second inspected value, and determining a second relationship between the selected second threshold, the inspected value and the second inspected value.

Step 152 involves (a) determining a location of a pair of (inspected value, second inspected value) that are characterized by the selected type, in relation to a first threshold of the selected type, and (b) determining a location of a pair of (inspected value, reference value) that are characterized by the selected type, in relation to the second threshold of that type. Referring to FIGS. 6-11, if the inspected and reference pixel type is TYPE 2 then step 152 includes (a) determining whether a pair of (inspected value, second reference value) are above threshold TS17 337, and (d) determining whether a pair of (inspected value, reference value) are above threshold TS7 237.

Step 152 includes indicating a presence of a defect in response to at least one of the first relationship and the second relationship. For example, if both pairs are above the threshold, indicating that there is no defect, then method 101 can continue to check other inspected pixels, and step 160 is followed by step 120 (if another die or another portion of a die must be illuminated to obtain a pixel) or step 124 (for processing another pixel from an image that was already acquired during steps 121-123). If at least one of the pairs are above the corresponding threshold, indicating that there is a defect, an additional step of evaluating the distance between the at least the one pair that is above its corresponding threshold and the corresponding threshold. The length of said distance is usually proportional to a probability of a presence of a defect, although he length can also be responsive to the type of defect (for example, the material from which a particle is made and the like).

The first relationship can reflect a distance between the selected first threshold and a data element reflecting both the inspected value and the second inspected value. The second relationship reflects a distance between the selected second threshold and a data element reflecting both the inspected value and the reference value. It is noted that step 160 may include selecting a selected relationship out of the first relationship and the second relationship. Each relationship may reflect a probability of a presence of a defect; and wherein selecting the relationship that reflects a higher probability of a presence of a defect.

The present invention is applicable to the manufacture of various types of semiconductor devices, particularly high-density semiconductor devices having a design rule of about 0.18 m and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

We claim:

1. A method for inspecting a substrate for defects, comprising:
   obtaining an inspected pixel and a reference pixel;
   calculating an inspected value and a reference value, the inspected value representative of the inspected pixel and the reference value representative of the reference pixel;
   selecting exactly one of the inspected value and the reference value as a selected value based on a comparison of the inspected value and the reference value;
   selecting a threshold in response to the selected value; and
   determining a relationship between the selected threshold, the reference value and the inspected value to indicate a presence of a defect.

2. The method of claim 1 wherein selecting a selected value comprises evaluating which value out of the reference value and the inspected value is more noisy and selecting the less noisy value.

3. The method of claim 2 wherein the selected value is the lower value.

4. The method of claim 1 wherein the inspected value is representative of the inspected pixel and neighboring inspected pixels and the reference value is representative of the reference pixel and neighboring reference pixels.

5. The method of claim 1 wherein the relationship is a comparison between the selected threshold and a difference between the inspected value and the reference value.

6. The method of claim 1 wherein the inspected value is representative of a comparison between the inspected pixel and neighboring inspected pixels.

7. The method of claim 1 wherein the reference value is representative of a comparison between reference pixel and neighboring reference pixels.

8. The method of claim 1 wherein the inspected value represents a parameter selected from a group consisting of: a gray level of the inspected pixel; a ratio between the gray level of the inspected pixel and between a combination of gray levels of at least one inspected neighboring pixel; a difference between the gray level of the inspected pixel and a combination of gray levels of at least one inspected neighboring pixel.

9. The method of claim 1 wherein the inspected value reflects a difference between a maximal gray level of a neighboring inspected pixel and a minimal gray level of a neighboring inspected pixel.

10. The method of claim 1 wherein the inspected value reflects an average between gray levels of neighboring inspected pixels.

11. The method of claim 1 wherein the inspected value reflects an average between gray levels of neighboring inspected pixels and the gray level of the inspected pixel.

12. The method of claim 1 wherein the selected value is utilized for determining a reference pixel and inspected pixel type.

13. The method of claim 12 further comprising a step of building a pixel type database reflecting the commonality of distinct values of a selected value.

14. The method of claim 13 further comprising a step of allocating selected value ranges to pixel types.

15. The method of claim 14 comprising allocating the selected value ranges such that each range includes at least one local maxima that is above a predefined threshold.

16. The method of claim 14 wherein allocating selected value ranges according to range information provided by an end user.

17. The method of claim 14 wherein the ranges represent patterned areas of a die, and background of a die, accordingly.

18. The method of claim 14 wherein the ranges represent periodic cells, non-periodic cells and background, accordingly.

19. The method of claim 13 further comprising a step of updating the pixel type database during the step of selecting a selected value out of the inspected value and the reference value.

20. The method of claim 1 further comprising a step of building a reference inspected database reflecting the commonality of a pair of inspected value and reference value.

21. The method of claim 20 further comprising a step of defining a threshold in response to the reference inspected database.

22. The method of claim 12 further comprising a step of building, for each pixel type, a reference inspected type database reflecting the commonality of a pair of inspected value and reference value of inspected values pixels that belong to the pixel type.

23. The method of claim 22 further comprising a step of determining a threshold for each pixel type in response to the reference inspected database associated with the pixel type.

24. The method of claim 23 wherein the step of selecting a threshold comprises selecting a threshold that is associated with a pixel type of the selected pixel out of the inspected pixel and the reference pixel.

25. The method of claim 1 wherein the reference pixel is obtained from memory.

26. The method of claim 1 wherein the reference pixel is obtained from another die.

27. The method of claim 1 wherein the reference pixel is obtained from a pattern that is ideally identical to a pattern from which the inspected pixel is obtained.

28. The method of claim 1 wherein the step of calculating comprises providing an alarm signal indicative of a probability of a presence of a defect.

29. The method of claim 28 further comprising a step of building a reference inspected database reflecting the commonality of a pair of inspected value and reference value.

30. The method of claim 29 further comprising a step of defining a threshold in response to the reference inspected database.

31. The method of claim 30 wherein a value of the alarm signal is responsive to a distance between the selected threshold and the pair of inspected value and reference value.

32. A method for inspecting a substrate for defects, comprising:
    illuminating the substrate;
    obtaining an inspected pixel;
    calculating an inspected value representative of the inspected pixel;
    determining whether to obtain a reference pixel from a same die of the inspected pixel or from a reference pixel from another die;
    obtaining a reference pixel in response to the determination;
    calculating an inspected value representative of the inspected pixel;
    selecting exactly one of the inspected value and the reference value as a selected value based on a comparison of the inspected value and the reference value;
    selecting a threshold in response to the selected value; and
    comparing the selected threshold to a difference between the reference value and the inspected value to determine the presence of a defect.

33. The method of claim 32 wherein selecting a selected value comprises a step of evaluating which value out of the reference value and the inspected value is more noisy and selecting the less noisy value.

34. The method of claim 33 wherein the selected value is the lower value.

35. The method of claim 32 wherein the inspected value is representative of the inspected pixel and neighboring inspected pixels or of a comparison between the inspected pixel and neighboring inspected pixels.

36. The method of claim 32 wherein the inspected value is representative of a parameter selected from the group consisting of:
    a gray level of the inspected pixel;
    a ratio between the gray level of the inspected pixel and between a combination of gray levels of at least one inspected neighboring pixel;
    a difference between the gray level of the inspected pixel and a combination of gray levels of at least one inspected neighboring pixel;
    a difference between a maximal gray level of a neighboring inspected pixel and a minimal gray level of a neighboring inspected pixel; and
    an average between gray levels of neighboring inspected pixels.

37. The method of claim 32 wherein the selected value is utilized for determining a reference pixel and inspected pixel type.

38. The method of claim 37 further comprising a step of determining the inspected pixel type and the step of determining is responsive to the inspected pixel type.

39. The method of claim 32 further comprising a step of building a pixel type database reflecting the commonality of distinct values of the selected value.

40. The method of claim 39 further comprising a step of allocating selected value ranges to pixel types.

41. The method of claim 39 comprising allocating selected value ranges such that each range includes at least one local maxima that is above a predefined threshold.

42. The method of claim 39 wherein allocating selected value ranges according to range information provided by an end user.

43. The method of claim 39 wherein the ranges represent patterned areas of a die, and background of a die, accordingly.

44. The method of claim 39 wherein the ranges represent periodic cells, non-periodic cells and background, accordingly.

45. The method of claim 39 further comprising a step of updating the pixel type database during the step of selecting a selected value out of the inspected value and the reference value.

46. The method of claim 32 further comprising a step of building a reference inspected database reflecting the commonality of a pair of inspected value and reference value.

47. The method of claim 46 further comprising a step of defining a threshold in response to the reference inspected database.

48. The method of claim 37 further comprising a step of building, for each pixel type, a reference inspected type database reflecting the commonality of a pair of inspected value and reference value of inspected values pixels that belong to the pixel type.

49. The method of claim 48 further comprising a step of determining a threshold for each pixel type in response to the reference inspected database associated with the pixel type.

50. The method of claim 48 wherein the step of selecting a threshold comprises selecting a threshold that is associated with a pixel type of the selected pixel out of the inspected pixel and the reference pixel.

51. The method of claim 32 wherein the step of calculating comprises providing an alarm signal indicative of a probability of a presence of a defect.

52. The method of claim 47 wherein a value of a alarm signal is responsive to a distance between the selected threshold and the pair of inspected value and reference value.

53. The method of claim 32 wherein the variance of the neighborhood is responsive to at least one parameter selected from the group consisting of:
  a ratio between the gray level of the inspected pixel and between a combination of gray levels of at least one inspected neighboring pixel;
  a difference between the gray level of the inspected pixel and a combination of gray levels of at least one inspected neighboring pixel;
  a difference between a maximal gray level of a neighboring inspected pixel and a minimal gray level of a neighboring inspected pixel; and
  an average between gray levels of neighboring inspected pixels.

54. A method for inspecting a substrate for defects, comprising:
  obtaining an inspected pixel, inspected neighboring pixels and a reference pixel;
  calculating an inspected value, a second inspected value and a reference value, the second inspected value representative of the inspected pixel alone, the reference value representative of the reference pixel and neighboring reference pixels and the inspected value representative of the inspected pixel and inspected neighboring pixels;
  selecting exactly one of the inspected value and the reference value as a selected value based on a comparison of the inspected value and the reference value;
  selecting a first threshold and a second threshold in response to the selected value;
  determining a first relationship between the selected first threshold, the inspected value and the second inspected value, determining a second relationship between the selected second threshold, the inspected value and the reference value; and
  indicating a presence of a defect in response to at least one of the first relationship and the second relationship.

55. The method of claim 54 wherein the first relationship reflects a distance between the selected first threshold and a data element reflecting both the inspected value and the second inspected value.

56. The method of claim 54 wherein the second relationship reflects a distance between the selected second threshold and a data element reflecting both the inspected value and the reference value.

57. The method of claim 54 wherein the step of indicating comprises selecting a selected relationship out of the first relationship and the second relationship.

58. The method of claim 54 wherein selecting a selected value comprises a step of evaluating which value out of the reference value and the inspected value is more noisy and selecting the less noisy value.

59. The method of claim 58 wherein the selected value is the lower value.

60. The method of claim 54 wherein the reference value represents a parameter selected from a group consisting of: a gray scale of the reference pixel; a ratio between the gray scale of the reference pixel and between a combination of gray scales of at least one reference neighboring pixel; a difference between the gray scale of the reference pixel and a combination of gray scales of at least one reference neighboring pixel.

61. The method of claim 54 wherein the inspected value represents a combination of at least one gray scale of at least one inspected neighboring pixel.

62. The method of claim 54 wherein the inspected value reflects a difference between a maximal gray scale of a neighboring inspected pixel and a minimal gray scale of a neighboring inspected pixel.

63. The method of claim 54 wherein the inspected value reflects an average of gray scales of neighboring inspected pixels.

64. The method of claim 54 wherein the reference value reflects an average of gray scales of neighboring reference pixels and the gray scale of the reference pixel.

65. The method of claim 54 wherein the second inspected value reflects a brightness of the inspected pixel.

66. The method of claim 54 wherein the selected value is utilized for determining a reference pixel and inspected pixel type.

67. The method of claim 66 further comprising a step of building a pixel type database reflecting the commonality of distinct values of the selected value.

68. The method of claim 67 further comprising a step of allocating selected value ranges to pixel types.

69. The method of claim 68 comprising allocating selected value ranges such that each range includes at least one local maxima that is above a predefined threshold.

70. The method of claim 68 wherein allocating selected value ranges according to range information provided by an end user.

71. The method of claim 68 wherein the ranges represent patterned areas of a die, and background of a die, accordingly.

72. The method of claim 68 wherein the ranges represent periodic cells, non-periodic cells and background, accordingly.

73. The method of claim 67 further comprising a step of updating the pixel type database during the step of selecting a selected value out of the inspected value and the reference value.

74. The method of claim 54 further comprising a step of building a reference inspected database reflecting the communality of a pair of inspected value and reference value, and building an inspected neighborhood database reflecting the communality of pair of inspected value and neighboring inspected value.

75. The method of claim 74 further comprising a step of defining a set of first thresholds in response to the reference inspected database.

76. The method of claim 74 further comprising a step of defining a set of second thresholds in response to the inspected neighborhood database.

77. The method of claim 66 further comprising a step of building, for each pixel type, a reference inspected type database reflecting the commonality of a pair of inspected value and reference value of pixels that belong to that pixel type.

78. The method of claim 77 further comprising a step of determining a first threshold for each pixel type in response to the reference inspected type database associated with said pixel type.

79. The method of claim 77 wherein the step of selecting a first threshold out of a set of first thresholds comprises selecting a first threshold that is associated with a pixel type of the selected pixel out of the inspected pixel and the reference pixel.

80. The method of claim 66 further comprising a step of building, for each pixel type, a neighborhood inspected type database reflecting the commonality of a pair of inspected value and reference value of pixels that belong to that pixel type.

81. The method of claim 80 further comprising a step of determining a second threshold for each pixel type in response to the neighborhood inspected type database associated with said pixel type.

82. The method of claim 80 wherein the step of selecting a second threshold out of a set of second thresholds comprises selecting a second threshold that is associated with a pixel type of the selected pixel out of the inspected pixel and the reference pixel.

* * * * *